United States Patent [19]
Munoz-Bustamante et al.

[11] Patent Number: 5,809,291
[45] Date of Patent: Sep. 15, 1998

[54] INTEROPERABLE 33 MHZ AND 66 MHZ DEVICES ON THE SAME PCI BUS

[75] Inventors: Carlos Munoz-Bustamante, Durham; Jerry William Pearce, Apex, both of N.C.

[73] Assignee: International Business Machines Corp., Armonk, N.Y.

[21] Appl. No.: 802,369

[22] Filed: Feb. 19, 1997

[51] Int. Cl.[6] .................................................. G06F 1/12
[52] U.S. Cl. ........................................ 395/556; 395/551
[58] Field of Search ................................... 395/551, 556, 395/555, 200.38, 200.63, 284, 287, 290, 845, 878, 880

[56] References Cited

U.S. PATENT DOCUMENTS

| | | | |
|---|---|---|---|
| 4,344,132 | 8/1982 | Dixon et al. | 364/200 |
| 4,688,168 | 8/1987 | Gudaitis et al. | 364/200 |
| 5,109,490 | 4/1992 | Arimilli et al. | 364/DIG. 1 |
| 5,237,676 | 8/1993 | Arimilli et al. | 395/550 |
| 5,263,172 | 11/1993 | Olnowich | 395/800 |
| 5,274,784 | 12/1993 | Arimilli et al. | 395/556 X |
| 5,689,660 | 11/1997 | Johnson et al. | 395/880 X |
| 5,727,171 | 3/1998 | Iachetta, Jr. | 395/287 |

OTHER PUBLICATIONS

InfoWorld Jun. 3, 1996 v18 n23 p1 (2): Title: PCI bus picks up speed: Robust design will double throughput. (PCI bus technology) (Technology Information) (Brief Article) Author: Quinlan, Tom.

Microprocessor Report Jun. 17, 1996 v10 n8 p11 (5); Title: AGP speeds 3D graphics. Author: Yao, Yong.

Technical Disclosure Bulletin, vol. 38 No. 07 Jul. 1995: Title: Method of Synchronizing Data across Asynchronous Time–Division Multiplex Bus: Authors: K.B. Macauley and P.A. Manson.

A.G.P. Interface Specification Jul. 31, 1996.

*Primary Examiner*—Thomas M. Heckler
*Attorney, Agent, or Firm*—Martin J. McKinley

[57] ABSTRACT

An extended PCI bus (100) accepts both standard 33 MHz (101–102) and extended 66 MHz (103–104) PCI I/O devices, and permits the intermixing and interoperability of both types of devices on the same bus. Each extended 66 MHz initiator device (103) includes a target memory (205) that is programmed at boot up to include a list of address ranges of all extended 66 MHz devices. Each extended 66 MHz device includes a clock multiplier (202) that generates an internal 66 MHz clock signal by doubling the 33 MHz bus clock frequency. This clock multiplier may be in the form of a simple edge detecting frequency doubler (FIG. 4), or a phase locked loop (FIG. 5) that can also provide for phase adjustments to alter the skew between the bus and internal clocks. To transfer data between two extended 66 MHz devices, an extended initiator device sends, during the address/control phase of the bus cycle, a fast read or write command to the extended target device over the C/BE lines of the bus. Subsequently during the data phase of the bus cycle, data is transferred over the bus at the 66 MHz rate using the 66 MHz internal clock signals.

26 Claims, 7 Drawing Sheets

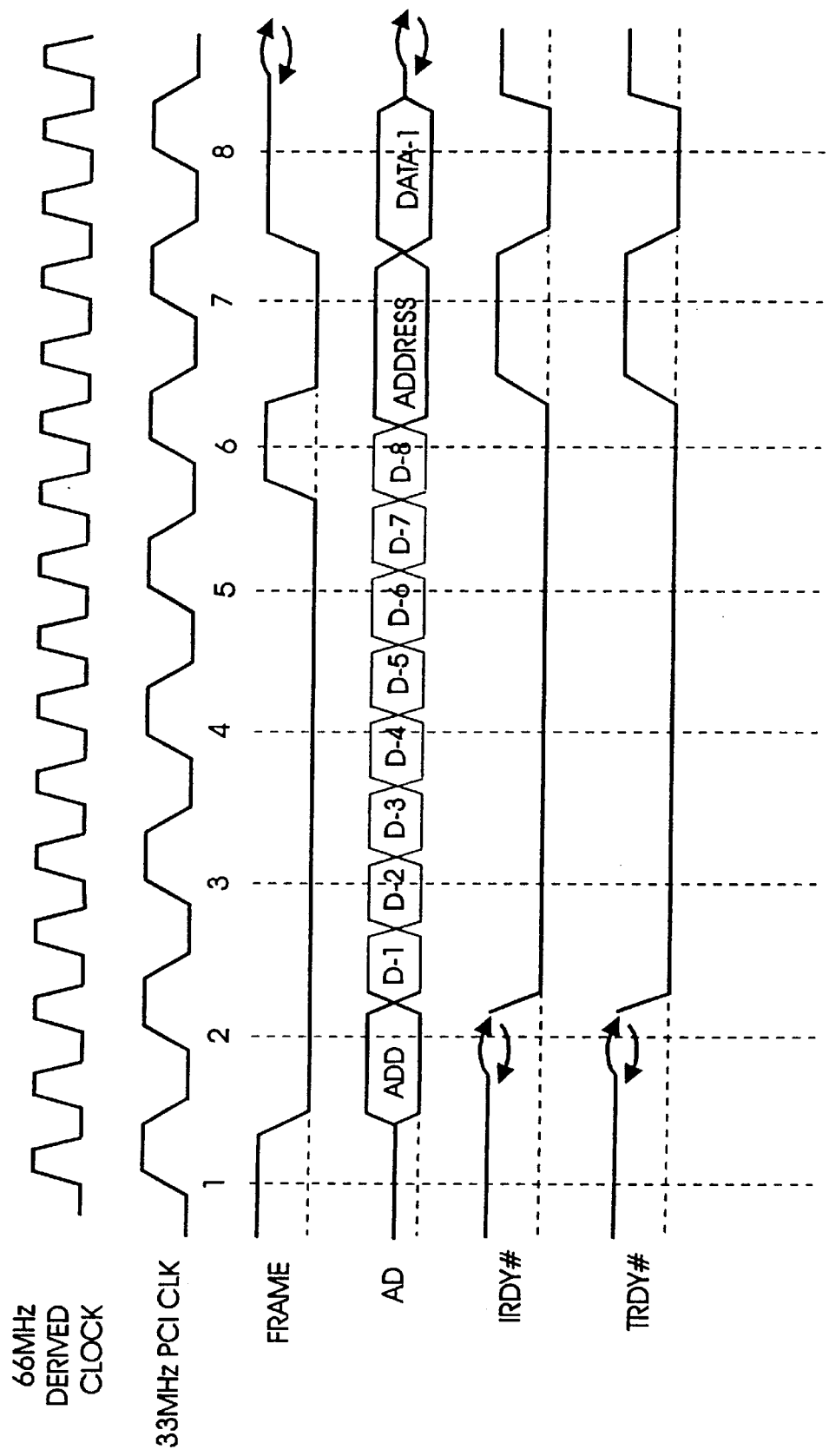

INTEROPERABLE 33 MHZ AND 66 MHZ DEVICES ON THE SAME PCI BUS

BACKGROUND of the INVENTION

This invention pertains to computer systems and other information handling systems and, more particularly, to a computer system in which synchronous data transfers can occur over a bus at speeds greater than the bus clock frequency.

Increasing the speed of an I/O device in a computer system has obvious advantages. However, any increase in performance is usually constrained by the architecture of the bus to which the device is attached. A change in the bus architecture may permit higher speed devices to be coupled to the bus, but a new or modified bus architecture may not be compatible with older and slower devices. The use of two bus architectures, one to support older devices and one for newer and faster devices, has obvious cost and complexity disadvantages.

These problems are evident in the Peripheral Component Interface or "PCI" bus, which has enjoyed recent popularity in personal computers. The original PCI standard specified a 33 MHz bus, but a newer 66 MHz bus standard has recently been adopted. Although adapter cards for both the 33 MHz and 66 MHz buses are mechanically compatible in that both types of cards mate with the same type of bus connector, they are electrically incompatible. Thus, a 33 MHz card can only be plugged into a 33 MHz bus and, for 66 MHz operation, a 66 MHz card can only be plugged into a 66 MHz bus. Since the vast majority of PCI adapter cards sold today have been designed according to the 33 MHz standard and very few 66 MHz cards are currently available, it is not practical to manufacture a computer that only supports 66 MHz PCI cards. Consequently, if 66 MHz PCI cards are to be supported, current computer system designs usually include two separate PCI buses; a standard 33 MHz bus and a separate 66 MHz high speed bus.

The improvement to the PCI bus architecture described below, however, supports both the older 33 MHz card design as well as 66 MHz cards that have been designed to work with this extended bus architecture. The extended bus design also permits both types of cards to be intermixed on the same bus, such that peer-to-peer communications between two cards will occur at 33 MHz if at least one of the cards is of the older 33 MHz design, while communications occur at 66 MHz if both cards are of the extended 66 MHz design. Since the bridge to the host processor is designed to handle both 33 MHz and 66 MHz data transfers, communications between a device and the host will occur at the maximum rate supported by the selected device.

In addition to an improved PCI bus architecture, another embodiment of the invention is also described that has general applicability to many other bus architectures, such as AGP. This other embodiment also employs two clocks wherein one of the clocks may be phased shifted relative to the other clock through the use of a phase shifting circuit. This other embodiment is claimed and described in more detail in application Ser. No. 08/808,073;

Other bus designs that provide compatibility of fast and slow I/O devices have been tried. For example, U.S. Pat. No. 5,263,172 describes a system in which additional handshake lines are provided on the bus to establish the speed of a data transfer. In this system, one handshake line carries information indicative of the speed capability of an initiator device to other devices on the bus, while another handshake line carries information indicative of the speed capability of the targeted device back to the initiator device. Unfortunately, if additional pins are not available on the standard bus connector, as is the case with the PCI connector, additional handshake lines cannot be added. Furthermore, as described in the '172 patent, faster data transfers are performed by increasing the bus clock speed, but for some bus architectures such as PCI, most slower devices will not tolerate the faster clock rate. The improved PCI bus described below, however, provides for both fast and slow data transfers without increasing the bus clock frequency and without additional handshake lines.

SUMMARY OF THE INVENTION

Briefly, the invention is a computer system that includes a bus, wherein data can be transferred over the bus at a standard or a fast data transfer rates. A clock generator for generating a single frequency bus clock and a target device are coupled to the bus. An initiator device for initiating the transfer of a block of data between the target device and the initiator device is also coupled to the bus. The initiator device includes a clock multiplier having an input for receiving the single frequency bus clock. The clock multiplier generates a fast clock in synchronization with the single frequency bus clock by multiplying the bus clock frequency, such that the frequency of the fast clock is higher than and a multiple of the bus clock frequency. The initiator device also includes a target memory for storing target information. If the target device is capable of transferring the block of data at the fast data transfer rate, the target information identifies the target device as being fast data transfer rate capable. The initiator device also includes data transfer control circuitry for transferring the block of data between the initiator device and the target device at a selected one of the standard and fast data transfer rates. The data transfer control circuitry uses the single frequency bus clock to transfer the block of data at the standard data transfer rate, and the fast clock to transfer the block of data at the fast data transfer rate. The fast data transfer rate is selected if the target information stored in the target memory identifies the target device as being fast data transfer rate capable.

In another embodiment, the invention is an initiator device for use in a computer system that has a bus, a target device, and a single frequency bus clock, wherein a block of data can be transferred over the bus at a standard or fast data transfer rate. The fast data transfer rate is greater than and a multiple of the bus clock frequency. The initiator device includes a clock multiplier having an input for receiving the single frequency bus clock. The clock multiplier generates a fast clock in synchronization with the single frequency bus clock by multiplying the bus clock frequency, the frequency of the fast clock being higher than and a multiple of the bus clock frequency. The initiator device also includes a target memory for storing target information. If the target device is capable of transferring the block of data at the fast data transfer rate, the target information identifies the target device as being fast data transfer rate capable. The initiator device also includes data transfer control circuitry for transferring the block of data between the initiator device and the target device at a selected one of the standard and fast data transfer rates. The data transfer control circuitry uses the single frequency bus clock to transfer data at the standard data transfer rate, and the fast clock to transfer data at the fast data transfer rate. The fast data transfer rate is selected if the target information stored in said target memory identifies the target device as being fast data transfer rate capable.

In another embodiment, the invention is a target device for use in a computer system having a bus, an initiator device, and a single frequency bus clock. In this computer system, a block of data can be transferred over the bus at a selected one of standard and fast data transfer rates, wherein the fast data transfer rate is greater than and a multiple of the bus clock frequency. The target device includes a clock multiplier having an input for receiving the single frequency bus clock. The clock multiplier generates a fast clock in synchronization with the single frequency bus clock by multiplying the bus clock frequency, the frequency of the fast clock being higher than and a multiple of the bus clock frequency. A command decoder is also included in the target device for receiving and decoding both standard data transfer rate commands and fast data transfer rate commands received from the initiator device. The target device also includes data transfer control circuitry for transferring the block of data between the target device and the initiator device at a selected one of the standard and fast data transfer rates. The data transfer control circuitry uses the single frequency bus clock to transfer data at the standard data transfer rate, and the fast clock to transfer data at the fast data transfer rate. The fast data transfer rate is selected in response to a fast data transfer rate command being received and decoded by the command decoder.

BRIEF DESCRIPTION OF THE DRAWINGS

FIG. 7 is a timing diagram of the extended PCI bus during a transfer of data at the 66 MHz rate.

DESCRIPTION OF THE ILLUSTRATIVE EMBODIMENTS

The Peripheral Component Interface or "PCI" bus is a well known bus, the mechanical and electrical specifications for which are established by the PCI Local Bus Special Interest Group. Revision 2.1 of the PCI Local Bus Specification is incorporated by reference into this specification. There are two versions of the bus that are currently in use. The "standard 33 MHz PCI bus" has a 33 MHz bus clock such that address and data information is transferred over the bus at 33 MHz. The "standard 66 MHz PCI bus" has a 66 MHz bus clock such that address and data information is transferred over the bus at 66 MHz.

Initiator and target devices that attach to a PCI bus will be referred to as "standard 33 MHz devices" if they are designed to be attached only to the standard 33 MHz PCI bus and transfer information at a maximum of 33 MHz. Similarly, initiator and target devices will be referred to as "standard 66 MHz devices" if they are designed to attached to either a standard 33 MHz or a standard 66 MHz PCI bus, and operate at 66 MHz when attached to the standard 66 MHz PCI bus. Although standard 66 MHz devices can be attached to a standard 33 MHz PCI bus, they will only operate at 33 MHz when attached to the slower bus. Thus, although intermixing of standard 33 MHz and 66 MHz devices is possible on the standard 33 MHz PCI bus, compatibility is achieved by slowing the standard 66 MHz devices down to 33 MHz.

Figure 1:
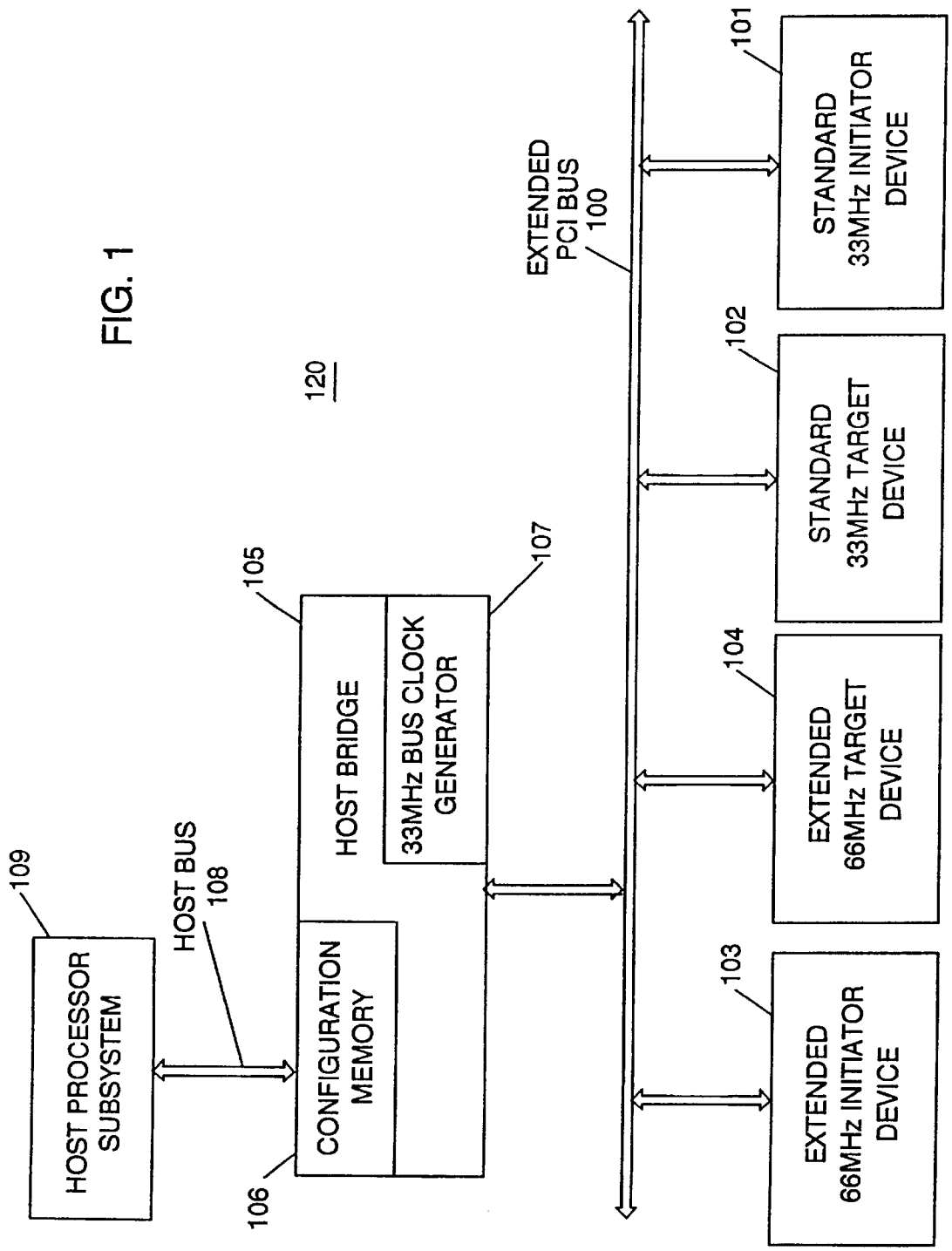
FIG. 1 is a block diagram of the computer system of the current invention having an extended PCI bus 100.

FIG. 1 is a block diagram of a computer system according to the present invention. Referring to this figure, the computer system 120 includes an "extended PCI bus" 100, which is an extension of the standard 33 MHz PCI bus. Bus 100 may also be referred to as the "extended bus." Extended bus 100 may also include a plurality of adapter card connectors (not illustrated) to attach optional device adapter cards to the bus, or devices may be "hard wired" directly to the bus. These adapter card connectors are preferably of the same type used with the standard 33 MHz PCI bus. If present, each of the adapter card connectors are preferably mechanically and electrically identical, such that various adapter cards can be plugged into extended bus 100 in any order.

Attached to bus 100 are a standard PCI initiator device 101, a standard PCI target device 102, an extended 66 MHz initiator device 103 and an extended 66 MHz target device 104. The terms "extended device" or "extended 66 MHz device" will be used to describe an initiator or target device according to the present invention that operates from a 33 MHz clock signal, but can transfer data over the extended PCI bus at 66 MHz. Additional standard or extended initiator and target devices can be attached to extended bus 100. Extended initiator device 103 and extended target device 104 are similar to standard 33 MHz PCI devices, except that they have additional circuitry described below that executes 66 MHz data transfers over the extended PCI bus 100 while otherwise adhering to standard 33 MHz PCI bus timings. Extended initiator 103 can also act as a standard 33 MHz or extended 66 MHz target.

Host bridge 105 is a well known bus-to-bus bridge circuit. Host bridge 105 functions and may be constructed in a manner similar to the Intel 82C430FX chip set. Host bridge 105 also contains additional extended initiator and extended target circuitry 106 that can execute data transfers at the faster 66 MHz rate. Bus clock generator 107, which is usually located in host bridge 105, generates a standard, fixed frequency 33 MHz bus clock signal for use on the clock line of extended bus 100. To provide communication to host processor subsystem 109, host bridge 105 transfers bus cycles on extended bus 100 to host bus 108. Host bridge 105 may also transfer bus cycles on bus 100 to other buses (not illustrated) in the computer system.

Figure 2:
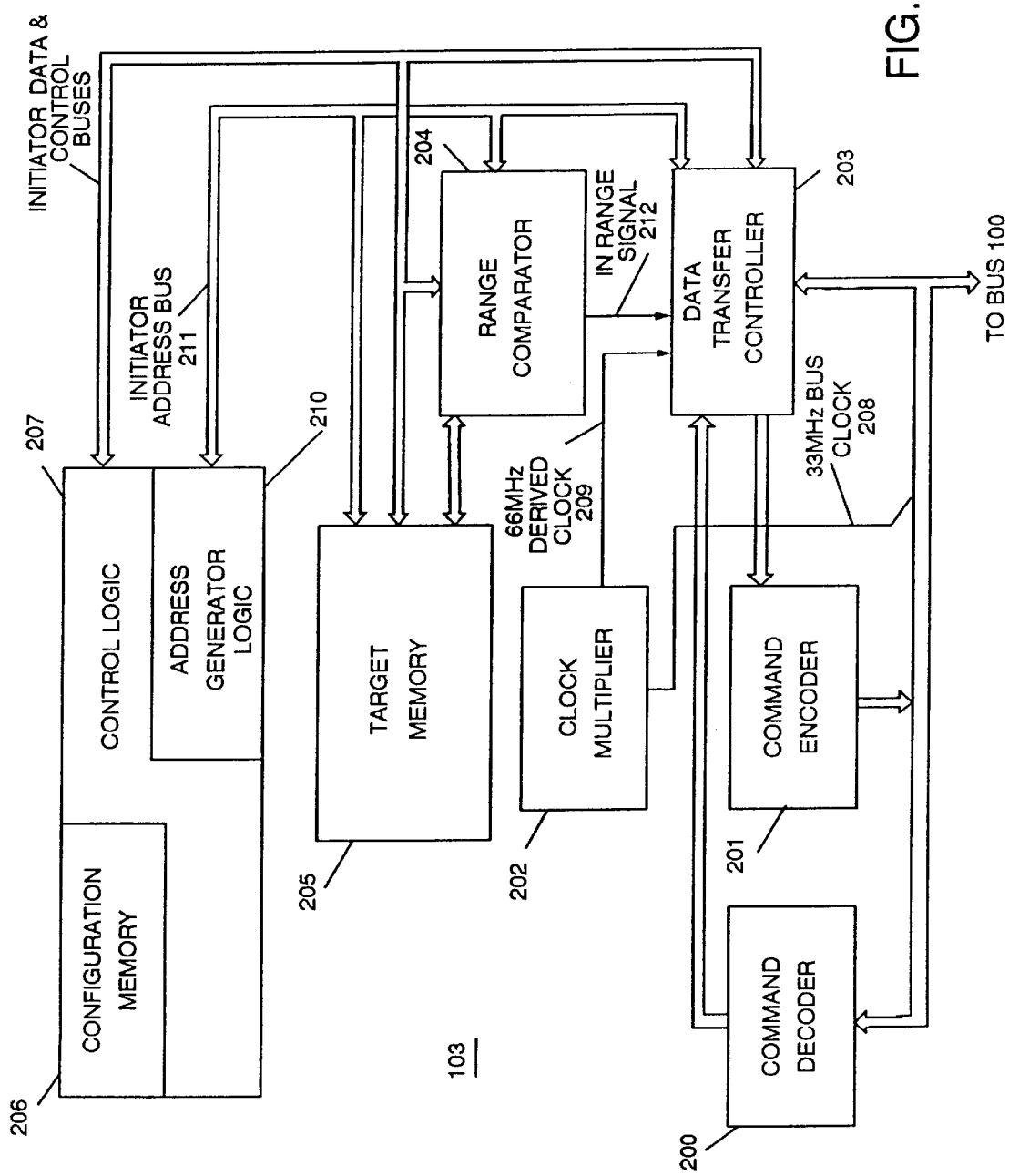
FIG. 2 is a block diagram of extended 66 MHz initiator device 103 of FIG. 1.
Figure 3:
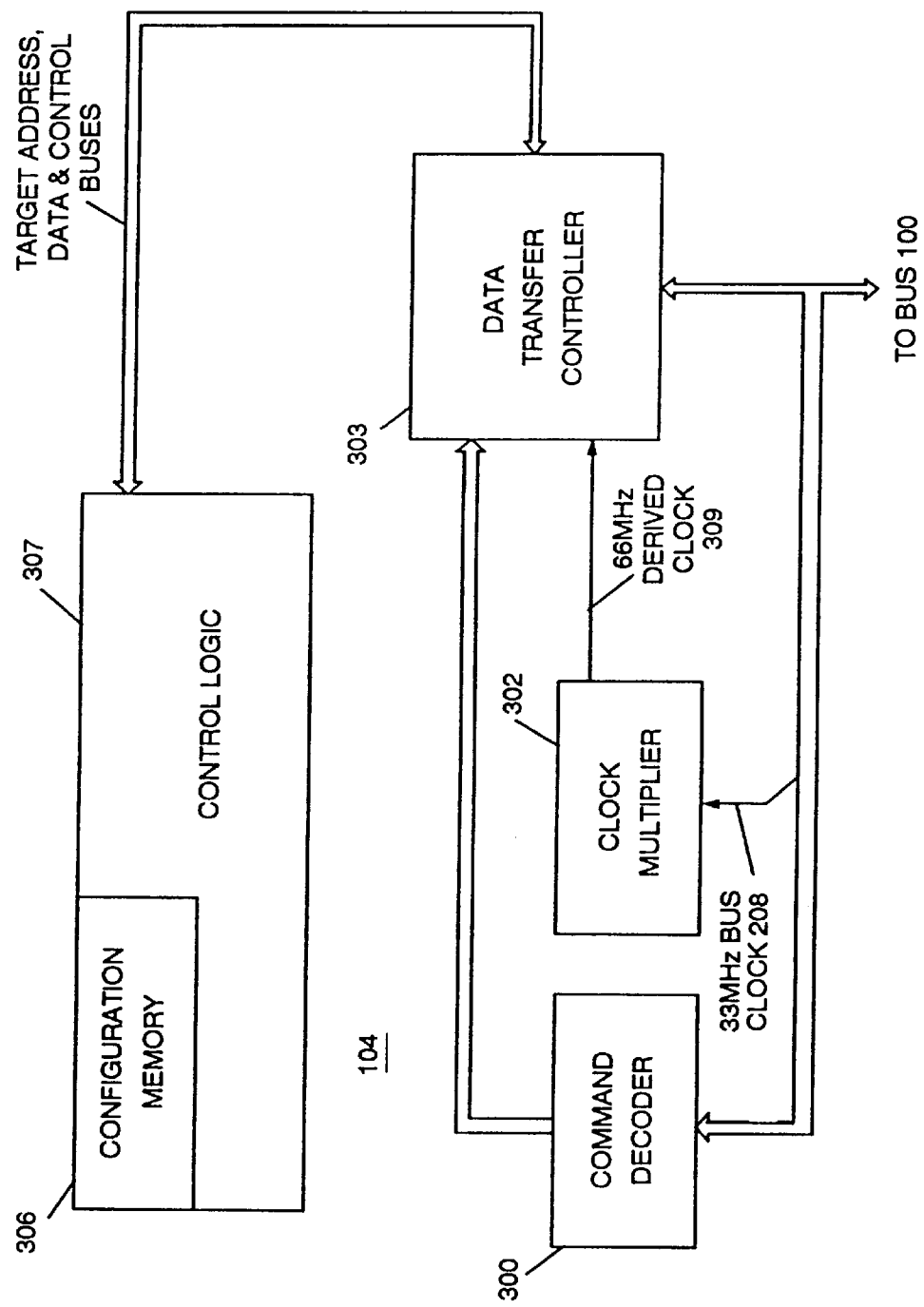
FIG. 3 is a block diagram of extended 66 MHz target device 104 of FIG. 1.

FIGS. 2 and 3 are block diagrams of extended initiator device 103 and extended target device 104, respectively. Referring to these figures, initiator device 103 and target device 104 may include a printed circuit board edge connector (not illustrated) that mates with one of the adapter card connectors of a PCI bus, such as extended bus 100. Command decoders 200 and 300 are connected to the control lines of bus 100 and are utilized to determine current bus cycle type (such as read, write, read-modify-write, etc.) during the address/control phase of the bus, and to determine other control information (such as byte enable) during the data phase. Command decoders 200 and 300 are constructed similar to a standard PCI command decoder, except that they decode both the standard commands and "fast transfer commands", which are described in more detail below. Command decoder 200 is operational, whether for reads or writes, when initiator device 103 is the target of a transaction initiated by another device. Similarly, command decoder 300 is operational, whether for reads or writes, when target device 104 is the target of a transaction initiated by another device. Command encoder 201 is constructed similar to a conventional command decoder, except that encoder 201 includes the additional capability to encode "fast transfer commands."

Clock multipliers 202 and 302 can be constructed as a well known clock doubler, such as the one illustrated in FIG. 4, or as a phase locked loop as illustrated in FIG. 5. Although the 66 MHz or "fast" data transfer mode of the illustrative embodiment is twice the speed of the 33 MHz or "slow" mode, other embodiments of the invention are possible in which the fast mode frequency is some other multiple of the slow mode frequency. For a different ratio of fast to slow speeds, the clock multiplier is preferably designed or adjusted to multiple the frequency of the bus clock signal by a corresponding amount. Data transfer controllers 203 and 303 control the transfer of data to and from other target or initiator devices, or the host processor. Data transfer controllers 203 and 303 are similar in design to a standard 33 MHz PCI bus interface circuit, but are expanded to include additional function described below.

Range comparator 204 can be constructed with low delay programmable logic or combinatorial logic. Slow programmable logic cannot be used since addresses are compared "on the fly" at a 33 MHz rate. The structure of such a range comparator is well known in the art. Target memory 205 can be implemented with SRAM, hardware registers or any other memory having fast access. The non-volatile portion of configuration memories 206 and 306 can be implemented with EEPROM, battery backed up CMOS RAM, or any other technology wherein data will be retained in the memory when the power to the device is OFF.

Control logic 207 and 307 performs host interface functions to communicate data between the device and host processor subsystem 109, and various initiator or target specific device functions such as multimedia or hard disk control. Other portions of control logic 207 maintain higher level state machines to, for example, implement the protocol required to communicate over bus 100. These higher level state machines in control logic 207 can be implemented with well known slower programmable logic, or a well known micro controller.

Figure 4A:
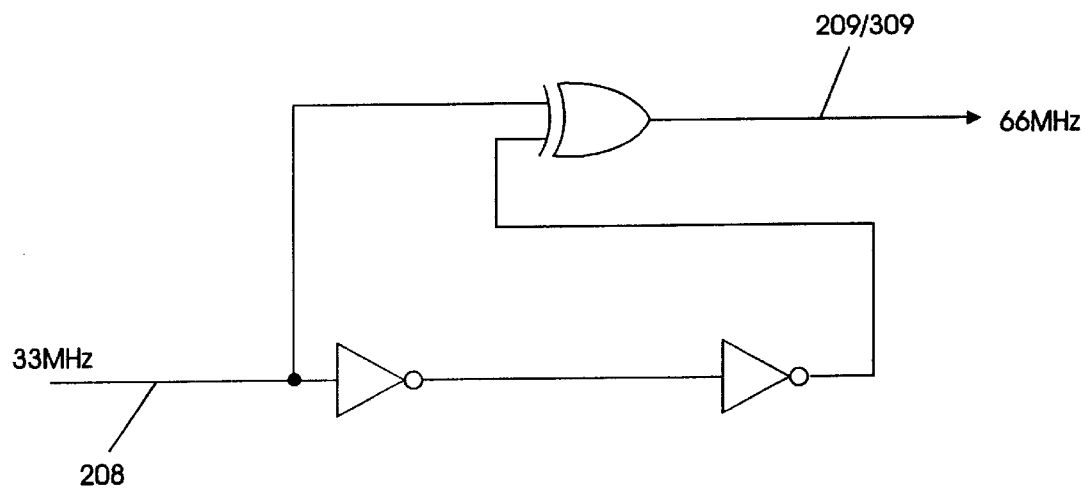
FIGS. 4A and 4B, which may be referred to collectively as FIG. 4, are a schematic diagram and a timing diagram, respectively, of an edge detecting clock doubler that doubles the frequency of the bus clock signal.
Figure 4B:
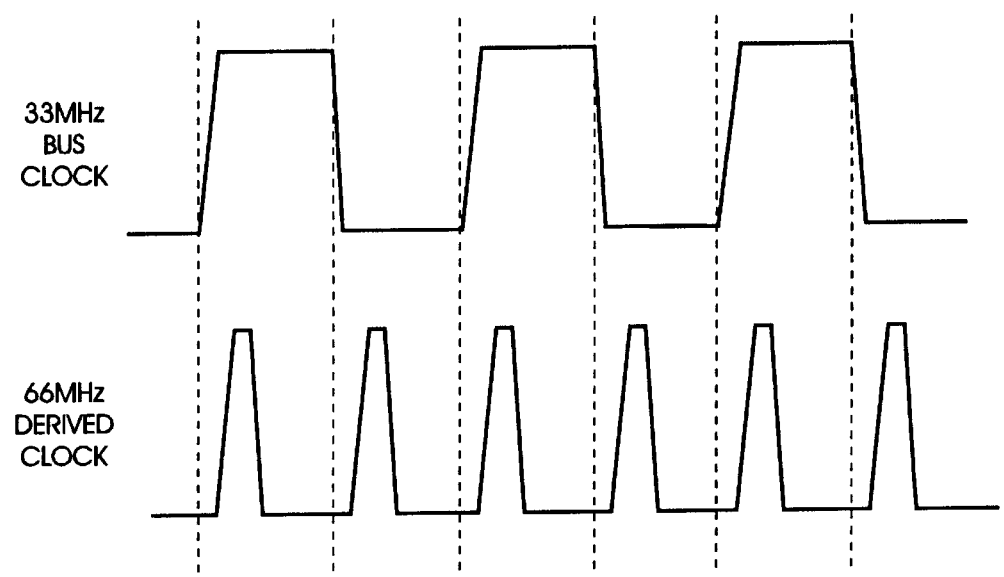

FIG. 4A is a schematic diagram of an edge detecting clock doubler that doubles the frequency of the bus clock signal, while FIG. 4B is a timing diagram illustrating the bus clock (top diagram) and output of the clock doubler (bottom diagram). Referring to these figures, clock multipliers 202 and 302 can be constructed in a manner similar to the edge detecting doubler circuit of FIG. 4A or, optionally, as a phase locked loop as discussed in more detail below. The clock doubler of FIG. 4A is well known in the art and can be constructed using standard combinatorial logic.

Figure 5A:
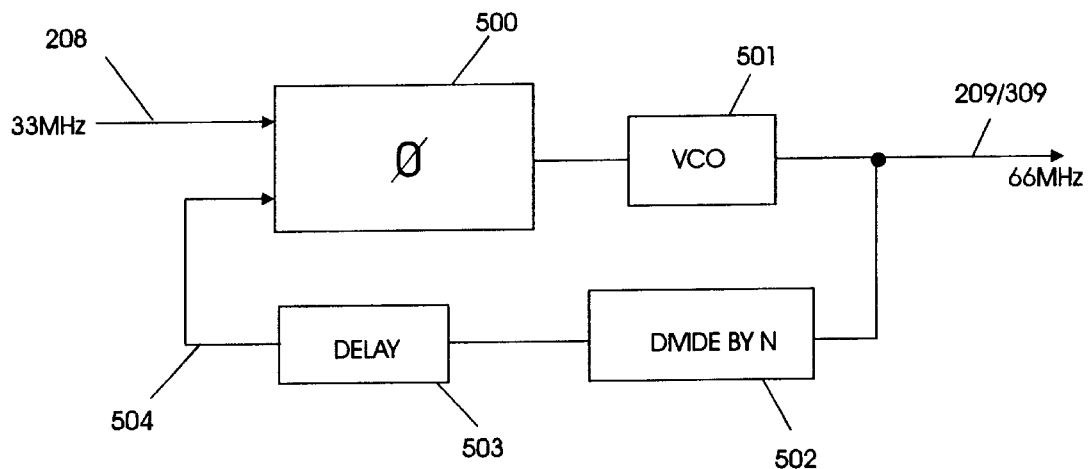
FIGS. 5A and 5B, which may be referred to collectively as FIG. 5, are a block diagram and a timing diagram, respectively, of a phase locked loop clock generator that multiples the frequency of the bus clock signal and/or phase shifts its output signal relative to the bus clock signal.
Figure 5B:
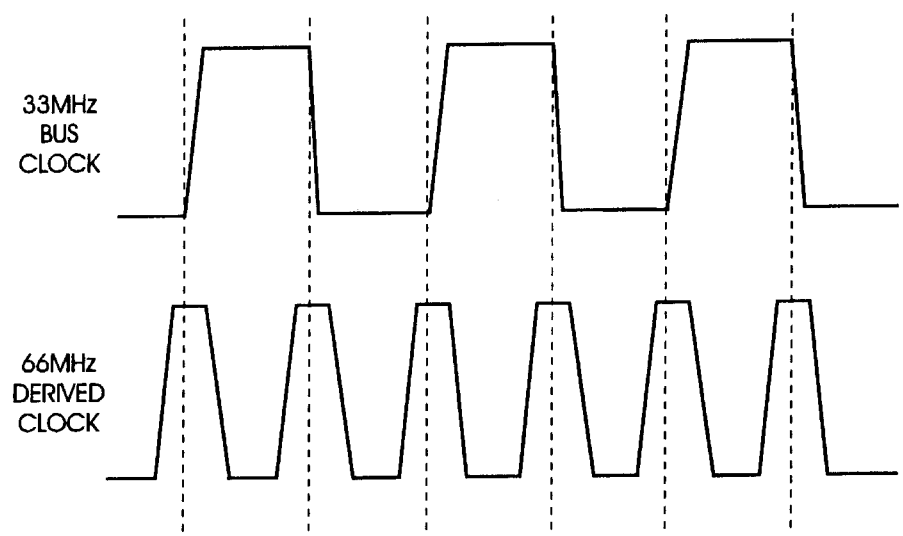

FIG. 5A is a schematic diagram of a phase locked loop clock multiplier and phase shifter that generates a second clock signal, the frequency of which is a multiple of the bus clock frequency, and the phase of which may be shifted relative to the bus clock signal. FIG. 5B is a timing diagram illustrating the bus clock (top diagram) and the output of the clock multiplier (bottom diagram) which, in this example, is at twice the frequency of the bus clock (N=2). Referring to these figures, clock multipliers 202 and 302 may be constructed as a well known phase locked loop circuit, such as the one illustrated in FIG. 5A. The standard frequency bus clock is fed into phase comparator 500 and is compared against a feedback signal 504 which is produced by VCO 501, divide by "N" circuit 502, and optional delay circuit 503. Note that dividing the frequency of VCO 501 by "N" in the feedback path effectively causes the output frequency of the VCO to be "N" times the input or bus clock frequency. In the preferred embodiment, N=2, such that the multiplier functions as a doubler; but other values of N, integer and non-integer, are also possible.

In another embodiment, N=1. In this embodiment a faster data transfer rate (e.g., faster when compared to the address transfer rate) is achieved by clocking the data on both the positive and negative edges of the second clock signal, or by alternately clocking the data on the bus clock and the second clock. In this embodiment, the ability to alter the phase of the second clock signal relative to the bus clock signal may be more critical.

Phase lag in the feedback path induced by delay 403 causes a phase lead in the output signal of VCO 501. Delay circuit 403 can be as simple as an RC time constant, a gate or several gates in series or, for a more stable output, an LC delay line can be used. The total delay through delay circuit 403 can be chosen so as to cancel out any internal delays encountered within each respective initiator and target device, such as circuit delay caused by data transfer controllers 203 and 303. The delay can also be chosen to cancel the delay introduced by the phase locked loop itself. In this case, the function of delay circuit 403 is to position the edges of the multiplied clock signal in some relationship to the edges of the external bus clock signal on extended bus 100. The value of delay 403 can also be made programmable through standard means to allow for positional delays to be canceled out. Note that phase delay could be introduced through the use of a quadrature phase detector, wherein the steady state phase angle between the input and the feedback signal is a constant. Other well known phase shifting circuits may also be suitable. For multiplier circuits 202 and 302, the phase locked loop circuit of FIG. 5A is preferred over the circuit of FIG. 4A because, as bus speeds increase or the physical length of the bus increases, there is a need have the ability to adjust the skew between the edges of the bus clock and the edges of multiplied clock signal. In addition, designers have two clock phases at tier disposal, the bus clock phase and the multiplied clock phase.

Operation and Backward Compatibility

The combination and interoperability of fast and slow devices on the same bus could be achieved, as discussed above, by the use of additional handshake lines to control the speed of impending data transfers. However, since existing 33 MHz PCI devices do not support handshaking for data transfer rate selection, this is not a viable alternative if backward compatibility is to be achieved. Therefore, rather than using handshaking techniques to switch between 33 MHz and 66 MHz data transfer rates, the current invention preconfigures (preferably at "boot up") extended 66 MHz initiator devices so that each of these devices is aware of the address ranges where extended 66 MHz devices reside. Thus, when transferring data between an initiator device and a specified address, a properly preconfigured extended initiator device knows the speed capability of the target device that resides at the specified address and, if that target device is fast data transfer rate capable, transfer the appropriate data at the faster 66 MHz rate.

Referring to FIGS. 1, 2 and 3, host processor subsystem 109 runs a configuration routine at boot up that automatically configures computer system 120. In a conventional manner, the configuration routine causes the processor to read "standard configuration data" from the non-volatile portion of each device's configuration memory and, after performing certain calculations, may write additional configuration data back to the configuration memory of each device. In addition to its conventional configuration functions, the configuration routine also causes the processor to read "extended configuration data" from the non-volatile portion of each extended device's configuration memory (e.g., memories 106, 206 and 306). This extended configuration data identifies the extended device as either an initiator or target device, and lists any memory mapped addresses within the device that data can be written to or read from at the faster 66 MHz data transfer rate. If the device is an initiator device, the extended configuration data also identifies the base address of the device's target memory 205.

The configuration routine then builds a table that has two sets of entries; the first set of entries is a list of base addresses of the target memories of each initiator device in the system, and the second entry is a lists of all "fast target address ranges" in the system that can accept data transfers at the faster 66 MHz rate. In building the list of fast target address ranges, the configuration routine executes a conflict resolution subroutine that insures that each fast target address range is free from conflict with any other address range in the computer system's address space. Upon completion of the table, the configuration routine causes the processor to write the second set of table entries (i.e., the list of all fast target address ranges) to the target memory of each of the initiator devices, as identified by the first set of table entries. As will be explained in more detail below, before an extended initiator device executes a data transfer to or from a specified target address, it first checks its target memory to determine if the target address lies within one of the address ranges in the list of fast target address ranges. If the target address falls within one of the listed ranges, the data transfer occurs at the faster 66 MHz rate; otherwise, the transfer will occur at the standard 33 MHz rate.

The PCI bus includes a clock line which, for the standard 33 MHz bus, carries a 33 MHz clock signal. The PCI bus also includes 32 "AD" lines that carry address signals during an address/control phase of a bus cycle, and data signals during a data phase, wherein each bus cycle consists of two or more clock cycles. Thus, for each bus cycle, address and control information is carried during a first clock cycle, followed by the transfer of data during one or more subsequent clock cycles. Some bus cycles may also include an additional "turn around" cycle or another type of cycle between the address and data phases.

The PCI bus includes 4 "C/BE" lines that carry control signals during the address/control phase of a bus cycle, and bus enable signals during the data phase. Since there are 4 C/BE lines, there are $2^4$ or 16 possible "commands" that can be sent over these lines during the address/control phase of the bus cycle. Of these 16 commands, 12 are defined by the PCI Local Bus Specification, Version 2.1, while the remaining 4 commands are undefined and are referred to in the specification as being "reserved." Extended PCI bus 100 makes use of two of the previously undefined commands by defining one of these commands as a "fast read" command, and the other as a "fast write" command. Thus, an extended initiator device sends one of these "fast transfer" commands over the C/BE lines during the address/control phase to prepare an extended target device for a fast 66 MHz data transfer. For backward compatibility with standard 33 MHz PCI devices, extended bus 100 carries the same fixed frequency, 33 MHz clock signal as the standard 33 MHz PCI bus. Furthermore, the timing of address and control signals on bus 100 during the address/control phase also occur at the 33 MHz rate. This is true for both standard 33 MHz (e.g., 101) and extended 66 MHz (e.g., 103) devices. Data transfers between two 33 MHz devices or between one 33 MHz and one extended 66 MHz device will also occur at the 33 MHz rate. However, as will be explained in more detail below, data transfers between two extended 66 33 MHz devices will occur at 66 MHz, even though the frequency of the bus clock remains at 33 MHz. These 66 MHz data transfers are not problematic for standard 33 MHz devices because the address/control phase of a bus cycle for a 66 MHz data transfer still occurs at 33 MHz. Thus, standard 33 MHz devices will properly decode address information during the address/control phase and, when the decoded address is not within the standard device's address range, go inactive during the 66 MHz data phase by placing their AD line drivers and receivers in an inactive mode. Therefore, fast devices can toggle the AD lines at 66 MHz with no effect to the slower 33 MHz devices. Although inactive, standard 33 MHz devices continue to monitor the control lines and the FRAME# line for an end-of-cycle signal, which maintain standard 33 MHz bus timings.

Thus, backward compatibility is achieved because the function of each line of extended bus 100 is identical to the corresponding line of a standard 33 MHz PCI bus and the timing of the signals on each line of extended bus 100 conforms to the specification adopted for the standard 33 MHz PCI bus (except that the timing of data signals during 66 MHz data transfers obviously deviates from the 33 MHz standard). During 66 MHz data transfers, it should be emphasized that only the timing of data signals deviates from the 33 MHz standard, while the timing of address and control signals that precede a 66 MHz data transfer conform to the standard 33 MHz PCI bus timings. Extended bus 100 also implements the same set of commands as the standard 33 MHz PCI bus. However, in addition to the standard command set, bus 100 also implements several "extended commands" that are interpreted by extended 66 MHz devices, but ignored by standard 33 MHz devices. The clock line of extended bus 100 also remains in conformance with the standard 33 MHz PCI bus specification and carries a fixed frequency, 33 MHz clock signal; even during 66 MHz data transfers.

The similarity of the function and timing of each of the lines of extended bus 100 to the standard 33 MHz PCI bus, and the similarity of the commands transmitted over the bus, make the extended PCI bus "backward compatible" with standard 33 MHz devices and permits the coexistence and interoperability of extended 66 MHz devices with standard 33 MHz PCI devices. In contrast, the current 66 MHz PCI bus specification requires two separate buses to support both 33 MHz and 66 MHz devices, and each of these buses requires its own host bridge circuit and its own adapter card connectors. With the two bus arrangement, the user cannot plug 33 MHz devices into a 66 MHz bus and, although a 66 MHz device can be plugged into the 33 MHz bus, the 66 MHz device will only operate at the slower 33 MHz rate when plugged into the slower bus.

To provide for 66 MHz data transfers on bus 100, extended 66 MHz devices contain an onboard clock multiplier/phase adjuster (202 and 302) to locally generate their own clock signal for use in fast 66 MHz data transfers. This clock multiplier/phase adjuster can consist of a very simple clock doubler circuit, an example of which is illustrated in FIG. 4, or a more sophisticated phase locked loop circuit as illustrated in FIG. 5. The multiplier value and the phase adjustment can be made to be implementation specific, including a phase adjustment which is also device technology specific or even physical location specific, as will be explained further below. For backward compatibility, extended 66 MHz devices are also capable of transferring data to and from standard 33 MHz devices at the slower 33 MHz rate.

A fast 66 MHz data transfer between an extended initiator device and an extended target device will now be described in more detail with reference to FIGS. 2 and 3 and the timing diagram of FIG. 7. Referring to these figures, onboard target memory 205 of initiator device 103 is configured at boot up to include a list of address ranges that can accept data transfers at the 66 MHz rate. When control logic 207 initiates a data transfer, address generation logic 210 will drive the target address onto initiator address bus 211. Range comparator 204 then compares the target address currently on address bus 211 to the list of address ranges stored in target memory 205 and, if the target address lies within one of the listed ranges, sends an "In Range" signal to data transfer controller 203 on line 212. Upon receiving the "In Range" signal, data transfer controller 203 then preloads a "fast transfer command" into command encoder 201. The fast transfer command may be either a fast write command or a fast read command (other fast transfer commands may be defined, such as a fast read-modify-write command). After loading a fast transfer command, data transfer controller 203 then starts a "fast bus cycle" on bus 100, which begins with a 33 MHz address/control phase. In addition to the target address being placed on the AD lines of bus 100 during the address/control phase, command encoder 201 also places the fast transfer command on the C/BE lines.

A command decoder 300 onboard the targeted device deciphers the fast transfer command signal on the C/BE lines and then instructs data transfer controller 303 to switch, for the data phase of the bus cycle, to the 66 MHz clock signal at the output of clock multiplier 302. Similarly, data transfer controller 203 of initiator device 103 switches to the 66 MHz clock signal at the output of clock multiplier 202. Thus, during the data phase of a fast write, initiator device 103 clocks data onto the AD lines of bus 100 at the 66 MHz rate using the output of clock multiplier/phase shifter 202. Similarly, during the data phase of a fast read, target device 104 clocks data onto the AD lines of bus 100 at the 66 MHz rate using the output of clock multiplier/phase shifter 302.

As with the standard PCI bus, it is the responsibility of target device 104 to issue a retry if the burst of data extends beyond the target's address range boundary. Upon such a retry, the new starting address is again compared by range comparator 204 against the list in target memory 205, whereupon the retry may ensue at either the 66 MHz rate or the 33 MHz rate.

For transfers between an extended initiator device (e.g., 103) and a standard 33 MHz target device (e.g., 102), the target address on bus 211 will not fall within one of the address ranges listed in target memory 205. Therefore, range comparator 204 will fail to find a match and the "In Range" signal will not be asserted on line 212. With "In Range" deasserted, data transfer controller 203 initiates a standard 33 MHz bus cycle, which includes a 33 MHz address/control phase followed by a 33 MHz data phase. For the address/control phase and in response to "In Range" being deasserted, data transfer controller 203 loads a "standard transfer command" into command encoder 201. The standard transfer command may be either a write command or a read command, as defined by the current PCI Local Bus Specification. After loading a standard transfer command into command encoder 201, data transfer controller 203 initiates the address/control phase by placing the target address on the AD lines of bus 100, and command encoder 201 places the standard transfer command on the C/BE lines of the bus. The targeted standard 33 MHz device then responds to these address and control signals in a conventional manner and, during the following data phase, data is transferred at the 33 MHz rate.

For transfers between a standard 33 MHz initiator device (e.g., 101) and an extended target device (e.g.,104), the command decoder 300 of the targeted extended device 104 will decode the standard transfer command received from the standard initiator device, and then direct data transfer controller 303 to use the 33 MHz bus clock for the subsequent 33 MHz data phase.

Note that while data is being transferred between an extended initiator device and an extended target device at the 66 MHz rate, the 33 MHz bus clock 208 is available to both initiator and target devices. Although the clock multipliers 202 and 302 can be implemented using the simple logic circuitry of FIG. 4A, which uses both edges of the bus clock signal to double the frequency, there is a delay or "skew" introduced relative to the 33 MHz bus clock when using this circuit. This skew, which is best illustrated in FIG. 4B, may be acceptable for certain frequencies of bus operation, but will eventually limit the frequency of bus operation or the physical length of the bus.

This skew and its associated limitations are alleviated by implementing either one or both of the clock multipliers 202 and 302 with a phase locked loop circuit, such as the one illustrated in FIG. 5A. The best results can be achieved by using a phase locked loop multiplier on both the initiator and target devices, which results in several advantages. First, the phase can be adjusted via delay circuit 503 so that, as illustrated in FIG. 5B, the signal at the output of the multiplier leads the 33 MHz bus clock, thereby permitting the bus clock's safety margin to be increased. Second, because of technological or other physical differences between two clock multipliers, the phase lead need not be the same for any two clock multipliers, and the delay through delay circuit 503 can be independently adjusted to obtain the proper phase lead to best line up the 66 MHz data relative to the edges of the 33 MHz bus clock. Third, the clock signals at the output of the phase locked loop multipliers will be generally more stable than they would be with the circuit of FIG. 4A. Phase lag can also be accommodated if necessary. To achieve phase lag, the delay value of delay circuit 503 can be increased to a point where phase lead at the output is, in effect, phase lag (i.e., phase lead exceeds 180°, thereby creating an effective phase lag). Alternately, a different type of phase comparator can be used to introduce lag or lead with or without the use of delay circuit 503, or circuit 503 could introduce phase lead in the feedback path, which results in phase lag at the output.

All control timings on extended bus 100 are identical to the timings of the standard 33 MHz PCI bus. In order to achieve this during fast 66 MHz data transfers, the data transfer controllers (e.g., 203) on extended initiator and target devices release the FRAME# control line when there are two data transfers remaining, rather than the standard one transfer remaining. Furthermore, extended initiator data transfer controller 203 will only issue fast 66 MHz data cycles if there are two or more units of data to be transferred. In other words, even though both initiator and target devices are extended 66 MHz devices, data will be transferred at the 33 MHz rate when there is only one unit of data to transfer.

Figure 6:
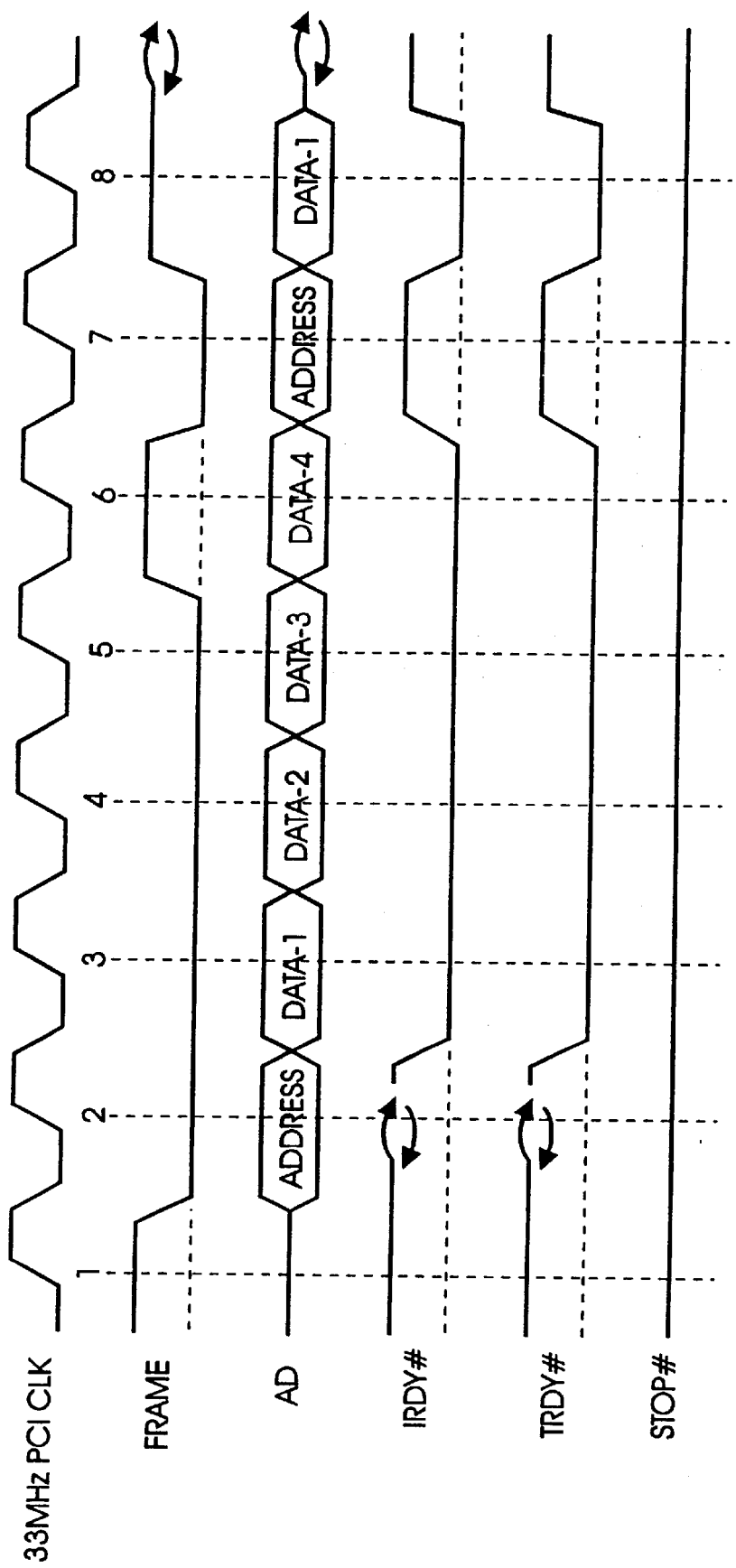
FIG. 6 is a timing diagram of a standard 33 MHz PCI bus or an extended PCI bus when transferring data at the 33 MHz clock rate.

In an alternative embodiment, target device's data transfer controller 303 and initiator device's data transfer controller 203 are designed such that FRAME# is released with only one data transfer remaining. This alternative embodiment has the advantage of less complex logic equations possibly at the cost of compatibility due to a timing change in the FRAME# signal. FIG. 7 illustrates the FRAME# signal according to this alternative embodiment. In this embodiment, the FRAME# signal is different from that of the standard 33 MHz timings of FIG. 6, but still within the letter of the standard PCI specification Although the invention described herein is implemented on a standard PCI bus, it is understood that one skilled in the art can expand these techniques to other bus standards. For example, the present invention can be easily extended to the Accelerated Graphics Port ("AGP") standard, which defines a point-to-point bus wherein data can be transferred at a 66 MHz or 133 MHz rate, and addresses transfer at a 66 MHz rate.

We claim as our invention:

1. A computer system, comprising:
   a bus, wherein data can be transferred over said bus at a selected one of standard and fast data transfer rates;
   a clock generator, coupled to said bus, for generating a single frequency bus clock;
   a target device coupled to said bus;
   an initiator device, coupled to said bus, for initiating the transfer of a block of data between said target device and said initiator device, said initiator device including:
      a clock multiplier having an input for receiving the single frequency bus clock, said clock multiplier for generating a fast clock in synchronization with the single frequency bus clock by multiplying the bus clock frequency, the frequency of the fast clock being higher than and a multiple of the bus clock frequency;
      a target memory for storing target information wherein, if said target device is capable of transferring the block of data at the fast data transfer rate, the target information identifies said target device as being fast data transfer rate capable;
      data transfer control circuitry for transferring the block of data between said initiator device and said target device at a selected one of the standard and fast data transfer rates, said data transfer control circuitry using the single frequency bus clock to transfer the block of data at the standard data transfer rate, and said data transfer control circuitry using the fast clock to transfer the block of data at the fast data transfer rate, the fast data transfer rate being selected if the target information stored in said target memory identifies said target device as being fast data transfer rate capable.

2. The computer system of claim 1, further comprising:
   a processor subsystem for computing the target information and for writing the target information into said target memory.

3. The computer system of claim 1, wherein said initiator device further comprises command circuitry for sending to said target device, if said target device is fast data transfer rate capable, a fast data transfer rate command in advance of the transfer of the block of data at the fast data transfer rate.

4. The computer system of claim 3, further comprising:
   a processor subsystem for computing the target information and for writing the target information into said target memory.

5. The computer system of claim 1, wherein said clock multiplier includes a phase locked loop circuit, said phase locked loop circuit having an input for receiving the single frequency bus clock, and an output for outputting the fast clock, said phase locked loop circuit having a phase adjuster circuit for adjusting the phase of the fast clock relative to the phase of the bus clock.

6. The computer system of claim 5, further comprising:
   a processor subsystem for computing the target information and for writing the target information into said target memory.

7. The computer system of claim 5, wherein said initiator device further comprises command circuitry for sending to said target device, if said target device is fast data transfer rate capable, a fast data transfer rate command in advance of the transfer of the block of data at the fast data transfer rate.

8. The computer system of claim 7, further comprising:
   a processor subsystem for computing the target information and for writing the target information into said target memory.

9. The computer system of claim 1, wherein:
   the target information stored in said target memory also includes address range information that identifies the address range of said target device; and
   said data transfer control circuitry includes a range comparator for comparing the address of the block of data to be transferred with the address range information.

10. The computer system of claim 9, further comprising:
    a processor subsystem for computing the target information and for writing the target information into said target memory.

11. The computer system of claim 9, wherein said initiator device further comprises command circuitry for sending to said target device, if said target device is fast data transfer rate capable, a fast data transfer rate command in advance of the transfer of the block of data at the fast data transfer rate.

12. The computer system of claim 11, further comprising:
    a processor subsystem for computing the target information and for writing the target information into said target memory.

13. The computer system of claim 9, wherein said clock multiplier includes a phase locked loop circuit, said phase locked loop circuit having an input for receiving the single frequency bus clock, and an output for outputting the fast clock, said phase locked loop circuit having a phase adjuster circuit for adjusting the phase of the fast clock relative to the phase of the bus clock.

14. The computer system of claim 13, further comprising:
    a processor subsystem for computing the target information and for writing the target information into said target memory.

15. The computer system of claim 13, wherein said initiator device further comprises command circuitry for sending to said target device, if said target device is fast data transfer rate capable, a fast data transfer rate command in advance of the transfer of the block of data at the fast data transfer rate.

16. The computer system of claim 15, further comprising:
    a processor subsystem for computing the target information and for writing the target information into said target memory.

17. An initiator device for use in a computer system having a bus, a target device, and a single frequency bus clock, wherein a block of data can be transferred over the bus at a selected one of standard and fast data transfer rates, wherein the fast data transfer rate is greater than and a multiple of the bus clock frequency, said initiator device comprising:

a clock multiplier having an input for receiving the single frequency bus clock, said clock multiplier for generating a fast clock in synchronization with the single frequency bus clock by multiplying the bus clock frequency, the frequency of the fast clock being higher than and a multiple of the bus clock frequency;

a target memory for storing target information wherein, if the target device is capable of transferring the block of data at the fast data transfer rate, the target information identifies the target device as being fast data transfer rate capable; and data transfer control circuitry for transferring the block of data between said initiator device and the target device at a selected one of the standard and fast data transfer rates, said data transfer control circuitry using the single frequency bus clock to transfer data at the standard data transfer rate, and said data transfer control circuitry using the fast clock to transfer data at the fast data transfer rate, the fast data transfer rate being selected if the target information stored in said target memory identifies the target device as being fast data transfer rate capable.

18. The computer system of claim 17, wherein said initiator device further comprises command circuitry for sending to the target device, if the target device is fast data transfer rate capable, a fast data transfer rate command in advance of the transfer of the block of data at the fast data transfer rate.

19. The computer system of claim 17, wherein said clock multiplier includes a phase locked loop circuit, said phase locked loop circuit having an input for receiving the single frequency bus clock, and an output for outputting the fast clock, said phase locked loop circuit having a phase adjuster circuit for adjusting the phase of the fast clock relative to the phase of the bus clock.

20. The computer system of claim 19, wherein said initiator device further comprises command circuitry for sending to the target device, if the target device is fast data transfer rate capable, a fast data transfer rate command in advance of the transfer of the block of data at the fast data transfer rate.

21. The computer system of claim 17, wherein:

the target information stored in said target memory also includes address range information that identifies the address range of the target device; and said data transfer control circuitry includes a range comparator for comparing the address of the block of data to be transferred with the address range information.

22. The computer system of claim 21, wherein said initiator device further comprises command circuitry for sending to the target device, if the target device is fast data transfer rate capable, a fast data transfer rate command in advance of the transfer of the block of data at the fast data transfer rate.

23. The computer system of claim 21, wherein said clock multiplier includes a phase locked loop circuit, said phase locked loop circuit having an input for receiving the single frequency bus clock, and an output for outputting the fast clock, said phase locked loop circuit having a phase adjuster circuit for adjusting the phase of the fast clock relative to the phase of the bus clock.

24. The computer system of claim 23, wherein said initiator device further comprises command circuitry for sending to the target device, if the target device is fast data transfer rate capable, a fast data transfer rate command in advance of the transfer of the block of data at the fast data transfer rate.

25. A target device for use in a computer system having a bus, an initiator device, and a single frequency bus clock, wherein a block of data can be transferred over the bus at a selected one of standard and fast data transfer rates, wherein the fast data transfer rate is greater than and a multiple of the bus clock frequency, said target device comprising:

a clock multiplier having an input for receiving the single frequency bus clock, said clock multiplier for generating a fast clock in synchronization with the single frequency bus clock by multiplying the bus clock frequency, the frequency of the fast clock being higher than and a multiple of the bus clock frequency;

a command decoder for receiving and decoding both standard data transfer rate commands and fast data transfer rate commands from the initiator device; and data transfer control circuitry for transferring the block of data between said target device and the initiator device at a selected one of the standard and fast data transfer rates, said data transfer control circuitry using the single frequency bus clock to transfer data at the standard data transfer rate, and said data transfer control circuitry using the fast clock to transfer data at the fast data transfer rate, the fast data transfer rate being selected in response to a fast data transfer rate command being received and decoded by said command decoder.

26. The computer system of claim 25, wherein said clock multiplier includes a phase locked loop circuit, said phase locked loop circuit having an input for receiving the single frequency bus clock, and an output for outputting the fast clock, said phase locked loop circuit having a phase adjuster circuit for adjusting the phase of the fast clock relative to the phase of the bus clock.

* * * * *